(12) United States Patent
Kawano

(10) Patent No.: US 8,071,400 B2
(45) Date of Patent: Dec. 6, 2011

(54) BUFFER LAYER AND MANUFACTURING METHOD THEREOF, REACTION SOLUTION, PHOTOELECTRIC CONVERSION DEVICE, AND SOLAR CELL

(75) Inventor: Tetsuo Kawano, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/897,412

(22) Filed: Oct. 4, 2010

(65) Prior Publication Data

US 2011/0081743 A1    Apr. 7, 2011

(30) Foreign Application Priority Data

Oct. 5, 2009    (JP) ................. 2009-231309
Jun. 8, 2010    (JP) ................. 2010-130999

(51) Int. Cl.
*H01L 21/00*    (2006.01)
(52) U.S. Cl. ....... 438/22; 438/29; 438/48; 257/E33.001; 257/E25.008; 257/E51.001; 313/504; 313/506; 428/690; 428/917
(58) Field of Classification Search .................... 438/22, 438/29, 48; 257/E33.001, E25.008, E51.001; 313/504, 506; 428/690, 917
See application file for complete search history.

(56) References Cited

U.S. PATENT DOCUMENTS 7,704,863 B2    4/2010   Ennaoui et al.
2008/0213467 A1*   9/2008   Yu et al. ................. 427/74

FOREIGN PATENT DOCUMENTS

JP    2008-510310 A    4/2008

OTHER PUBLICATIONS

D.A. Johnston et al., "Chemical bath deposition of zinc sulfide based buffer layers using low toxicity materials.", Thin Solid Films, NL Elsevier, vls. 403-404, pp. 102-106, 2002.

(Continued)

*Primary Examiner* — Hsien Ming Lee
(74) *Attorney, Agent, or Firm* — Sughrue Mion, PLLC

(57) ABSTRACT

A buffer layer manufacturing method, including: a preparation step for preparing a reaction solution which includes a component (Z) of at least one kind of zinc source, a component (S) of at least one kind of sulfur source, a component (C) of at least one kind of citrate compound, a component (N) of at least one kind selected from the group consisting of ammonia and ammonium salt, and water, in which the concentration of the component (C) is 0.001 to 0.25M, the concentration of the component (N) is 0.001 to 0.40M, and the pH of the reaction solution before the start of reaction is 9.0 to 12.0; and a film forming step for forming a Zn compound layer consisting primarily of Zn(S, O) and/or Zn(S, O, OH) by a liquid phase method with a reaction temperature of 70 to 95° C.

16 Claims, 2 Drawing Sheets

OTHER PUBLICATIONS

Office Action in corresponding Japanese Patent Application No. 2010-130999, dated Jul. 27, 2010.

F. Gode et al., "Investigations on the Physical Properties of the Polycrystalline ZnS thin Films Deposited by the Chemical Bath Deposition Method", Journal of Crystal Growth 299, 2007, pp. 136-141.

Hyun Joo Lee et al., "Deposition and Optical Properties of Nanocrystalline ZnS Thin Films by a Chemical Method", Current Applied Physics 7, 2007, pp. 193-197.

D. Johnston et al., "Chemical Bath Deposition of Zinc Sulphide Thin Films Using Sodium Citrate as a Complementary Complexing Agent", Journal of Materials Science Letters 20, 2001, pp. 921-923.

J. M. Dona et al., "Process and Film Characterization of Chemical-Bath-Deposited ZnS Thin Films", J. Electrochem. Soc., Jan. 1994, pp. 205-209, vol. 141, No. 1.

Notification of Reasons of Rejection dated Jan. 18, 2011, corresponding to JP 2010-130999.

* cited by examiner

PERSPECTIVE VIEW

CROSS-SECTIONAL VIEW

BUFFER LAYER AND MANUFACTURING METHOD THEREOF, REACTION SOLUTION, PHOTOELECTRIC CONVERSION DEVICE, AND SOLAR CELL

BACKGROUND OF THE INVENTION

1. Field of the Invention

The present invention relates to a buffer layer included in a photoelectric conversion device and a manufacturing method thereof, a reaction solution for use in manufacturing the buffer layer included in a photoelectric conversion device, a photoelectric conversion device having the buffer layer, and a solar cell using the photoelectric conversion device.

2. Description of the Related Art

Photoelectric conversion devices having a photoelectric conversion layer and electrodes conducting to the photoelectric conversion layer are used in various applications, including solar cells and the like. Most of the conventional solar cells are Si-based cells using bulk single-crystalline Si, polycrystalline Si, or thin film amorphous Si. Recently, however, research and development of compound semiconductor-based solar cells that do not depend on Si has been carried out. Two types of compound semiconductor-based solar cells are known, one of which is a bulk system, such as GaAs system and the like, and the other of which is a thin film system, such as CIS system formed of a group. Ib element, a group IIIb element, and a group VIb element, CIGS, or the like. The CI(G)S system is a compound semiconductor represented by a general formula, $Cu_{1-z}In_{1-x}Ga_xSe_{2-y}S_y$ (where, $0 \leq x \leq 1$, $0 \leq y \leq 2$, $0 \leq z \leq 1$), and when x=0 the formula represents a CIS system, while when x>0 it represents a CIGS system. The CIS and CIGS are herein collectively denoted as "CI(G)S".

Conventional thin film photoelectric conversion devices, such as CI(G)S systems and the like, generally include a CdS buffer layer between a photoelectric conversion layer and a translucent conductive layer (transparent electrode) formed thereon. In such a system, the buffer layer is normally formed by CBD (chemical bath deposition) method.

Roles of the buffer layer may include (1) prevention of recombination of photogenerated carriers (2) band discontinuity alignment (3) lattice matching (4) coverage of surface unevenness of the photoelectric conversion layer, and the like. For CI(G)S systems and the like, the CBD method, which is a liquid phase method, is preferably used in order to satisfy, in particular, the condition of (4) above, since the photoelectric conversion layer has relatively large surface unevenness.

In view of the environmental burden, Cd-free buffer layers are under study, and as a major component of Cd-free buffer layers, use of zinc systems, such as ZnO systems, ZnS systems, and the like is also under study.

Japanese Unexamined Patent Publication No. 2000-332280 (Patent Document 1) discloses a method of producing a Zn(O, OH, S) buffer layer using a reaction solution that includes a zinc-containing compound, a sulfur-containing compound, and an ammonium salt (claim 1). Patent Document 1 also describes that a reaction solution that includes 0.5 mol/l or less of ammonia is preferably used (claim 2). Patent Document 1 further describes that a reaction temperature of 10 to 100° C. and a pH of 9.0 to 11.0 are preferable (claims 6 and 7).

Japanese Unexamined Patent Publication No. 2001-196611 (Patent Document 2) discloses a method of producing a Zn(S, O) buffer layer using a reaction solution containing zinc acetate, thiourea, and ammonia (Example 3). In Example 3 of Patent Document 2, concentrations of the zinc acetate, thiourea, and ammonia are 0.025M, 0.375M, and 2.5M, respectively.

Japanese Unexamined Patent Publication No. 2002-343987 (Patent Document 3) discloses a method of producing a Zn(S, O, OH) buffer layer using a reaction solution which is a mixture of a solution provided by dissolving zinc salt in ammonia water or ammonium hydroxide water and an aqueous solution provided by dissolving sulfur-containing salt in purified water (claim 1). Patent Document 3 describes that the film forming is performed with a transparency level of the reaction solution of 100% to 50% (claim 1). Patent Document 3 further describes that a reaction temperature of 80 to 90° C. and a pH of 10.0 to 13.0 are preferable (claims 5 and 6).

Japanese Unexamined Patent Publication No. 2003-124487 (Patent Document 4) discloses a method of producing a Zn(S, O) buffer layer by a roll-to-roll process using a reaction solution containing zinc acetate, thiourea, and ammonia. In Example 2 of Patent Document 4, concentrations of the zinc acetate, thiourea, and ammonia are 0.025M, 0.375M, and 2.5M, respectively.

Japanese Unexamined Patent Publication No. 2002-118068 (Patent Document 5) discloses a method of producing a ZnS buffer layer using a reaction solution containing zinc sulfate, ammonia, and thiourea (claim 4). U.S. Pat. No. 7,704,863 (Patent Document 6) discloses a method of producing a buffer layer which includes the steps of dissolving a 0.05 to 0.5 mol/l of zinc sulfate and a 0.2 to 1.5 mol/l of thiourea in distilled water at a temperature of 70 to 90° C., adding about 25% ammonia in the amount of ⅓ of the water, and after the solution becomes transparent, dipping the substrate in the solution for about 10 minutes to maintain the temperature substantially at constant within the time (claim 1).

A literature by D. Johnston et al., "Chemical bath deposition of zinc sulphide thin films using sodium citrate as a complementary complexing agent", Journal of Materials Science Letters, Vol. 20, pp. 921-923, 2001 (Non-patent Document 1) describes a method of producing a ZnS thin film using a reaction solution containing zinc sulfate, thiourea, ammonia, and sodium citrate. In Non-patent Document 1, the film forming is performed at a reaction temperature of 60 to 80° C.

A literature by H. J. Lee and S. I. Lee, "Deposition and optical properties of nanocrystalline ZnS thin films by a chemical method", Current Applied Physics, Vol. 7, pp. 193-197, 2007 (Non-patent Document 2) describes a method of producing a ZnS thin film using a reaction solution containing zinc sulfate and thioacetamide. In Non-patent Document 2, the film forming is performed at a reaction temperature of 95° C. with a reaction time of 90 to 120 min.

When providing a buffer layer by CBD method, it is necessary to form a film that well covers an underlayer. Further, in view of the production efficiency and cost, a high reaction speed is preferable in the film forming process for the buffer layer by CBD method.

Japanese Unexamined Patent Publication No. 2007-242646 (Patent Document 7) discloses a method of forming a buffer layer by providing a nucleation site or a growing site, which is a particle of the same kind as or a different kind from that of the buffer layer, and forming the buffer layer with the nucleation site or the growing site as the starting point or the catalyst (claim 1). Further, ZnS is specifically cited as a major component of the particle serving as the nucleation site or the growing site and the buffer layer (claim 8).

As described in Patent Document 7, by growing a CBD film after forming a fine particle layer that functions as the nucleation site or the growing site of crystal growth, catalyst, or the like, the reaction speed of the CBD film forming process may be increased and a film well covering an underlayer may be formed stably by controlling the crystal growth through CBD reaction. This method, however, requires an additional process of forming the fine particle layer.

The present invention has been developed in view of the circumstances described above, and it is an object of the present invention to provide a Zn system buffer layer manufacturing method capable of forming a film well covering an underlayer at a practical reaction speed without essentially requiring a fine particle layer that functions as the nucleation site or the growing site of or catalyst for crystal growth.

SUMMARY OF THE INVENTION

A buffer layer manufacturing method of the present invention is a method of manufacturing a buffer layer of a photoelectric conversion device having a stacked structure in which a lower electrode, a photoelectric conversion semiconductor layer that generates a current by absorbing light, the buffer layer, a translucent conductive layer, and an upper electrode are stacked on a substrate, the method including:

a preparation step for preparing a reaction solution which includes a component (Z) of at least one kind of zinc source, a component (S) of at least one kind of sulfur source, a component (C) of at least one kind of citrate compound, a component (N) of at least one kind selected from the group consisting of ammonia and ammonium salt, and water, wherein:

the concentration of the component (C) is 0.001 to 0.25M;
the concentration of the component (N) is 0.001 to 0.40M; and
the pH before the start of reaction is 9.0 to 12.0; and
a film forming step for forming a Zn compound layer consisting primarily of Zn(S, O) and/or Zn(S, O, OH) by a liquid phase method with a reaction temperature of 70 to 95° C.

The term "consisting primarily of XXX" as used herein refers to that XXX accounts for 20% by mass or more unless otherwise specifically described.

According to the present invention, a Zn system buffer layer manufacturing method is provided which is capable of forming a film well covering an underlayer at a practical reaction speed without essentially requiring a fine particle layer that functions as a nucleation site or a growing site of or a catalyst for crystal growth.

DESCRIPTION OF THE PREFERRED EMBODIMENTS

Figure 1:
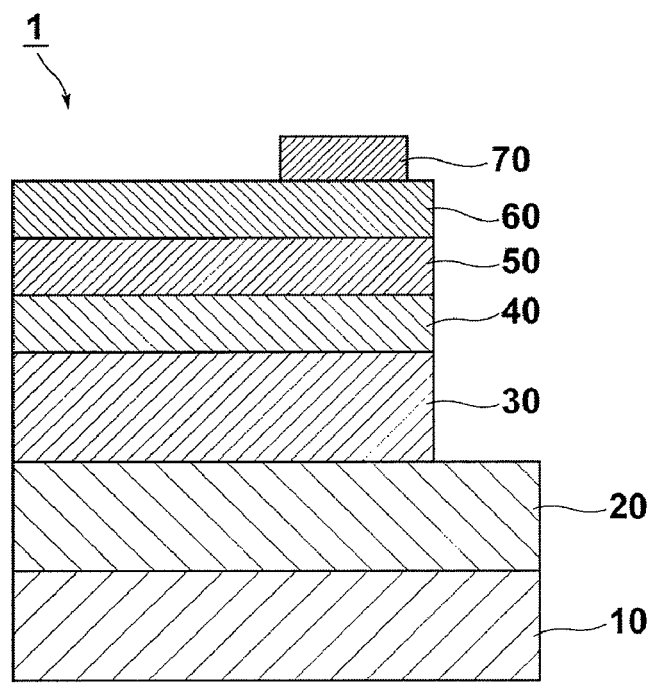
FIG. 1 is a schematic cross-sectional view of a photoelectric conversion device according to an embodiment of the present invention.

Hereinafter, the present invention will be described in detail.

[Buffer Layer Manufacturing Method]

The present invention relates to a buffer layer which includes a Zn compound layer consisting primarily of Zn(S, O) and/or Zn(S, O, OH) and a manufacturing method thereof. The representations of Zn(S, O) and Zn(S, O, OH) as used herein refers to a mixed crystal of zinc sulfide and zinc oxide, and a mixed crystal of zinc sulfide, zinc oxide, and zinc hydroxide, but a portion of zinc sulfide, zinc oxide, or zinc hydroxide may present without forming the mixed crystal, like in amorphous state.

The buffer layer of the present invention may be a layer of only a Zn compound layer consisting primarily of Zn(S, O) and/or Zn(S, O, OH), or a stacked layer including a Zn compound layer consisting primarily of Zn(S, O) and/or Zn(S, O, OH) and any other layer.

The buffer layer manufacturing method of the present invention is a method of manufacturing a buffer layer of a photoelectric conversion device having a stacked structure in which a lower electrode, a photoelectric conversion semiconductor layer that generates a current by absorbing light, the buffer layer, a translucent conductive layer, and an upper electrode are stacked on a substrate, the method including:

a preparation step for preparing a reaction solution which includes a component (Z) of at least one kind of zinc source, a component (S) of at least one kind of sulfur source, a component (C) of at least one kind of citrate compound, a component (N) of at least one kind selected from the group consisting of ammonia and ammonium salt, and water, wherein:

the concentration of the component (C) is 0.001 to 0.25M;
the concentration of the component (N) is 0.001 to 0.40M; and
the pH before the start of reaction is 9.0 to 12.0; and
a film forming step for forming a Zn compound layer consisting primarily of Zn(S, O) and/or Zn(S, O, OH) by a liquid phase method with a reaction temperature of 70 to 95° C.

Preferably, in the preparation step, the component (N) is mixed in a mixed solution of the component (Z), component (S), and water.

In the film forming step for forming a Zn compound layer consisting primarily of Zn(S, O) and/or Zn(S, O, OH), the present inventor has discovered that a layer well covering an underlayer may be formed at a practical reaction speed without essentially requiring a fine particle layer that functions as the nucleation site or the growing site of crystal growth, catalyst, or the like by optimizing the composition and pH of the reaction solution used and the reaction temperature in the manner as described above.

<Fine Particle Layer Forming Step>

The buffer layer manufacturing method of the present invention does not essentially require a fine particle layer forming step for forming a fine particle layer that functions as the nucleation site or the growing site of crystal growth, catalyst, or the like prior to the film forming step, but may have the fine particle layer forming step prior to the film forming step. When the buffer layer manufacturing method of the present invention has the fine particle layer forming step, the reaction speed in the film forming step may further be increased.

There is not any specific restriction on the composition of the fine particle layer. Preferably, the composition of the fine particle layer is a semiconductor and, as the layer formed in the latter step is a Zn system, a Zn system is preferably used, in which a fine particle layer of a plurality of one kind or two or more kinds of fine particles consisting primarily of at least one kind selected from the group consisting of ZnS, Zn(S, O), and Zn(S, O, OH) is particularly preferable.

There is not any specific restriction on the method of forming the fine particle layer. A method for applying a dispersion liquid in which a plurality of fine particle is dispersed, a method for depositing a plurality of fine particles by CBD (chemical bath deposition) method, and the like are preferable.

<Film Forming Step>

There is not any specific restriction on the film forming method of a Zn compound layer consisting primarily of Zn(S, O) and/or Zn(S, O, OH) by a liquid phase method, and the CBD method or the like is preferably used. The "CBD method" as used herein refers to a method of depositing a crystal on a substrate at a moderate speed in a stable environment using, as the reaction solution, a metal ion solution having a concentration and a pH that induce supersaturation by the equilibrium represented by a general formula, $[M(L)_i]^{m+} \Leftrightarrow M^{n+}+iL$ (where, M is a metal element, L is the ligand, and m, n, and i are positive numbers), and forming complexes of metal ion M.

Hereinafter, a preferable composition of the reaction solution will be described. There is not any specific restriction on the component (Z). Preferably, the component (Z) includes at lest one kind of compound selected from the group consisting of zinc oxide, zinc acetate, zinc nitrate, and hydrates of these. There is not any specific restriction on the concentration of the component (Z), and 0.001 to 0.5M is preferable.

There is not any specific restriction on the component (S), and it is preferable that the component includes thiourea. There is not any specific restriction on the concentration of the component (S), and 0.01 to 1.0M is preferable.

The component (C) serves as a complex forming agent and selection of appropriate kind and concentration of the component (C) causes complexes to be formed easily. Patent Documents 1 to 7 and Non-patent Document 2 cited under "Description of the Related Art", do not use a citrate compound. Non-patent Document 1 uses a sodium citrate, but the layer formed by CBD is a ZnS layer and not a Zn compound layer consisting primarily of Zn(S, O) and/or Zn(S, O, OH).

Use of the component (C), which is at least one kind of citrate compound, allows complexes to be formed easily without use of an excessive amount of ammonia in compassion with reaction solutions that do not use a citrate compound described in Patent Document 1 to 7 and Non-patent Document 2, whereby crystal growth by CBD reaction is well controlled and a film well covering an underlayer may be formed stably.

There is not any specific restriction on the component (C), and it is preferable that the component includes sodium citrate or a hydrate thereof. The concentration of sodium citrate in the reaction solution described in Non-patent Document 1 is 0.3M. In the present invention, the concentration of the component (C) is 0.001 to 0.25M. When the concentration of the component (C) is in the range described above, complexes are well formed and a film well covering an underlayer may be formed stably. A stable aqueous solution in which complexes are well formed may be provided when the concentration of the component (C) exceeds 0.25M but, on the other hand, it causes a slow reaction progress in deposition on the substrate or it may sometimes cause the reaction not to progress at all. Preferably, the concentration of the component (c) is 0.001 to 0.1M.

The component (N) functions as a pH control agent, but it also functions as a complex forming agent. There is not any specific restriction on ammonium salt which is used favorably as the component (C), and $NH_4OH$ and the like are preferably used. The ammonia concentration described in Non-patent Document 1 is 0.05 to 0.25M. In the present invention, the concentration of the component (N) is 0.001 to 0.40M. The pH may be adjusted by the component (N), whereby the solubility and supersaturation of the metal ions may be controlled. When the concentration of the component (N) is in the range from 0.001 to 0.4M, a high reaction speed is ensured and film forming with a practical production speed may be realized without requiring a fine particle layer forming step prior to the film forming step. When the concentration of the component (N) exceeds 0.40M, the reaction speed is reduced which requires a fine particle forming step prior to the film forming step or the like. Preferably, the concentration of the component (N) is 0.01 to 0.30M.

In the present embodiment, the pH of the reaction solution before the start of reaction is 9.0 to 12.0. When the reaction solution has a pH less than 9.0 before the start of reaction, the decomposition reaction of the component (S), such as thiourea or the like, does not progress at all or may progress but extremely slowly, so that the deposition reaction does not progress. The decomposition of thiourea is like following, which is described, for example, in J. M. Dona and J. Herrero, "Process and Film Characterization of Chemical-Bath-Deposited ZnS Thin Films", J. Electrochem. Soc., Vol. 141, No. 1, pp. 205-209, 1994, and F, Göde et al., "Investigations on the physical properties of the polycrystalline ZnS thin films deposited by the chemical bath deposition method", Journal of Crystal Growth, Vol. 299, pp. 136-141, 2007.

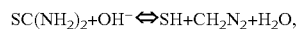

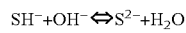

When the reaction solution has a pH exceeding 12.0 before the start of reaction, the influence of the composition (N), which also functions as a complex forming agent, to stabilize the solution becomes large and the deposition reaction does not progress or may progress but extremely slowly. Preferably, the pH of the reaction solution before the start of reaction is 9.5 to 11.5.

The concentration of the component (N) in the reaction solution used in the present invention is 0.001 to 0.4M, which normally causes the pH of the reaction solution before the start of reaction to lie in the range from 9.0 to 12.0 without requiring any particular pH control, such as the use of a pH control agent other than the component (N).

There is not any specific restriction on the pH of the reaction solution after reaction. Preferably, the pH of the reaction solution after reaction is 7.5 to 11.0. When the pH of the reaction solution after reaction is less than 7.5, it implies that there was a time period in which reaction did not progress which is meaningless from the viewpoint of efficient manufacturing. Further, when the pH is reduced in such amount in the system which includes ammonia having buffering effect, it is highly likely that the ammonia is evaporated excessively in a heating process, which may require improvement in the manufacturing process. On the other hand, when the pH of the reaction solution after reaction exceeds 11.0, decomposition of thiourea is accelerated but most of zinc ions are stabilized as ammonium complexes and the progress of deposition reaction may significantly be slowed down. More preferably, the pH of the reaction solution after reaction is 9.5 to 10.5.

In the reaction solution of the present invention, the pH after reaction lies in the range from 7.5 to 11.0 without requiring any particular pH control, such as the use of a pH control agent other than the component (N).

In the present embodiment, the reaction temperature is 70 to 95° C. A reaction temperature below 70° C. causes a reduced reaction speed and a thin film does not grow or may grow but it is difficult to obtain a thin film of desired thickness (e.g., 50 nm or greater) at a practical reaction speed. On the other hand, a reaction temperature exceeding 95° C. causes many air bubbles to be generated in the reaction solution which may adhere to the surface of the film, whereby the growth of a flat and uniform film is prevented. Further, if the reaction takes place in an open system, a change in the concentration may occur due to evaporation of the solvent, making it difficult to maintain a stable thin film deposition condition. A preferable reaction temperature is 80 to 90° C. There is not any specific restriction on the reaction time. The present invention may perform reaction at a practical reaction speed without requiring a fine particle layer. Although the reaction time depends on the reaction temperature, a layer well covering an underlayer with a thickness sufficient as the buffer layer may be formed, for example, in a reaction time of 10 to 60 minutes.

The reaction solution used in the present invention is an aqueous solution. The pH of the reaction solution is not a strong acid condition. Although the pH of the reaction solution may be 11.0 to 12.0, the reaction may be performed under a moderate pH condition of less than 11.0. The reaction temperature essentially required is not so high. Thus, the reaction of the present invention has less environmental burden and the damage to the substrate is reduced to a minimum.

For example, it is proposed to use an anodized substrate, as the substrate of photoelectric conversion device, such as an anodized substrate formed of an Al-based Al base with an $Al_2O_3$-based anodized film formed on at least one surface side, an anodized substrate formed of a compound base of a Fe-based Fe material and an Al-based Al material attached to at least one surface side of the Fe material with an $Al_2O_3$-based anodized film formed on at least one surface side of the compound base, an anodized substrate formed of a base of a Fe-based Fe material and an Al-based Al film formed on at least one surface side of the Fe material with an $Al_2O_3$-based anodized film formed on at least one surface side of the base, and the like.

The anodized substrates described above do not have high acid or alkali resistance. The present invention may perform reaction under a moderate pH condition, so that, even when such a substrate is used, the invention does not give damage to the substrate and may provide a high quality photoelectric conversion device.

Further annealing of at least the buffer layer at a temperature below a heat-proof temperature of the substrate after the film forming step may increase the conversion efficiency of the photoelectric conversion device (refer to examples to be described later). The annealing temperature needs to be below a heat-proof temperature of the substrate to be used, and an annealing temperature of 150° C. or higher is effective. There is not any specific restriction on the annealing method, and heating with a heater, heating in a dehydrator, or light annealing, such as laser annealing, flash lamp annealing, and the like, may be used.

[Buffer Layer]

The buffer layer of the present invention is a layer manufactured by the buffer layer manufacturing method of the present invention.

[Reaction Solution]

The reaction solution itself used in the manufacturing method of the present invention is novel and is included in the present invention.

The reaction solution of the present invention is a solution for use in manufacturing a Zn compound layer consisting primarily of Zn (S, O) and/or Zn (S, O, OH) included in a buffer layer of a photoelectric conversion device having a stacked structure in which a lower electrode, a photoelectric conversion semiconductor layer that generates a current by absorbing light, a buffer layer that includes the Zn compound layer, a translucent conductive layer, and an upper electrode are stacked on a substrate, the solution including:

a component (Z) of at least one kind of zinc source, a component (S) of at least one kind of sulfur source, a component (C) of at least one kind of citrate compound, a component (N) of at least one kind selected from the group consisting of ammonia and ammonium salt, and water, wherein:

the concentration of the component (C) is 0.001 to 0.25M;

the concentration of the component (N) is 0.001 to 0.40M; and the pH before the start of reaction is 9.0 to 12.0.

Preferably, the reaction solution of the present invention includes, as the component (Z), at least one kind selected from the group consisting of zinc sulfate, zinc acetate, zinc nitrate, and hydrates thereof. Preferably, the reaction solution of the present invention includes thiourea as the component (S). Preferably, the reaction solution of the present invention includes sodium citrate and/or a hydrate thereof as the component (C). Preferably, the pH of the reaction solution of the present invention after reaction is 7.5 to 11.0.

[Photoelectric Conversion Device]

A photoelectric conversion device of the present invention is a device having a stacked structure in which a lower electrode (back contact electrode), a photoelectric conversion semiconductor layer that generates a current by absorbing light, a buffer layer, a translucent conductive layer (transparent electrode), and an upper electrode (grid electrode) are stacked on a substrate, wherein the buffer layer is a layer formed by the buffer layer manufacturing method of the present invention.

There is not any specific restriction on the substrate, and the following may be cited: a glass substrate, a metal substrate, such as stainless substrate, on which an insulating layer is formed, an anodized substrate formed of an Al-based Al base with an $Al_2O_3$-based anodized film formed on at least one surface side, an anodized substrate formed of a compound base of a Fe-based Fe material and an Al-based Al material attached to at least one surface side of the Fe material with an $Al_2O_3$-based anodized film formed on at least one surface side of the compound base, an anodized substrate formed of a base of a Fe-based Fe material and an Al-based Al film formed on at least one surface side of the Fe material with an $Al_2O_3$-based anodized film formed on at least one surface side of the base, and a resin substrate, such as polyimide substrate.

Flexible substrates, such as a metal substrate on which an insulating film is formed, an anodized substrate, a resin substrate, and like, are preferably used as they can be manufactured by a roll-to-roll process (continuous process).

In view of the thermal expansion coefficient, heat resistance, and insulating property of the substrate, an anodized substrate selected from the group consisting of an anodized substrate formed of an Al-based Al base with an $Al_2O_3$-based anodized film formed on at least one surface side, an anodized substrate formed of a compound base of a Fe-based Fe material and an Al-based Al material attached to at least one surface side of the Fe material with an $Al_2O_3$-based anodized film formed on at least one surface side of the compound base, and an anodized substrate formed of a base of a Fe-based Fe material and an Al-based Al film formed on at least one surface side of the Fe material with an $Al_2O_3$-based anodized film formed on at least one surface side of the base is particularly preferable.

[Photoelectric Conversion Device]

Figure 3:
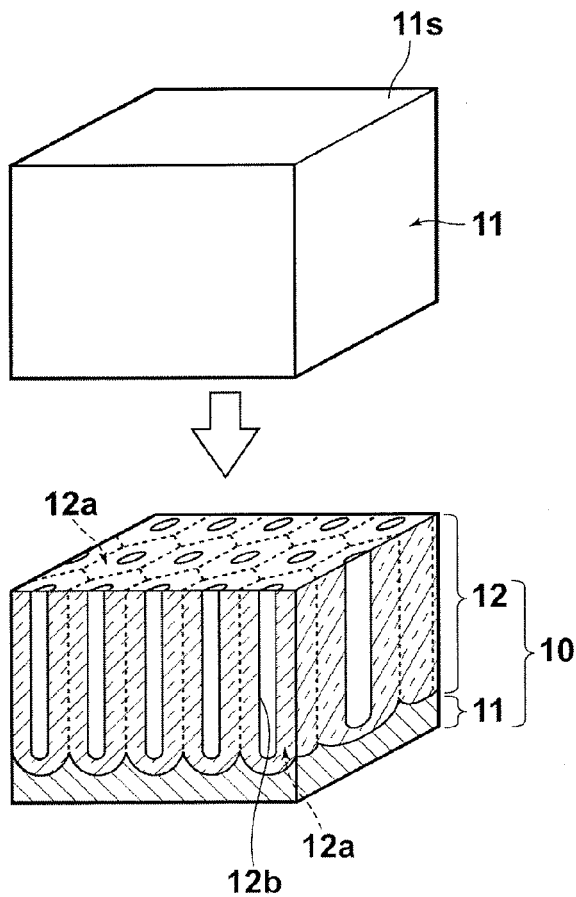
FIG. 3 is a perspective view illustrating a method of manufacturing an anodized substrate.

A structure of a photoelectric conversion device according to an embodiment of the present invention will be described with reference to the accompanying drawings. FIG. 1 is a schematic cross-sectional view of the photoelectric conversion device. Figure shows schematic cross-sectional views of two substrates, illustrating the configurations thereof, and FIG. 3 is a perspective view of an anodized substrate, illustrating a manufacturing method thereof. In the drawings, each component is not drawn to scale in order to facilitate visual recognition.

Photoelectric conversion device 1 is a device having substrate on which lower electrode (back contact electrode) 20, photoelectric conversion layer 30, buffer layer 40, window layer 50, translucent conductive layer (transparent electrode) 60, and upper electrode (grid electrode) 70 are stacked in this order. Window layer 50 may sometimes be omitted.

(Substrate)

Figure 2:
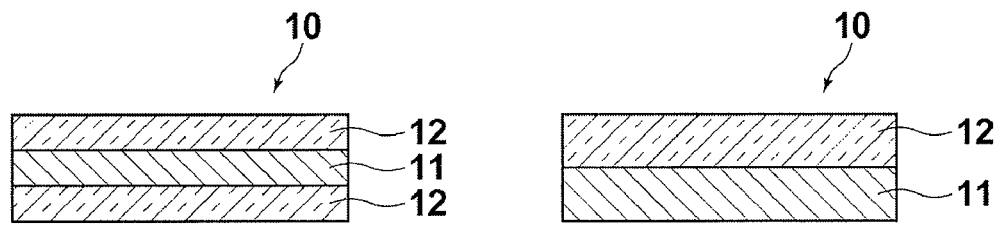
FIG. 2 shows schematic cross-sectional views of two anodized substrates, illustrating the configurations thereof.

In the present embodiment, substrate 10 is an anodized substrate obtained by anodizing at least one of the sides of Al-based Al base 11. Substrate 10 may be Al base 11 with anodized film 12 formed on each side, as illustrated on the left of FIG. 2 or Al base 11 with anodized film 12 formed on either one of the sides, as illustrated on the right of FIG. 2. Anodized film 12 is a film mainly consisting of $Al_2O_3$.

Preferably, substrate 10 is a substrate of Al base 11 with anodized film 12 formed on each side as illustrated on the left of FIG. 3 in order to prevent warpage of the substrate due to the difference in thermal expansion coefficient between Al and $Al_2O_3$, and detachment of the film due to the warpage during the device manufacturing process.

Anodization may be performed by dipping Al base 11, which is cleaned, smoothed by polishing, and the like as required, as an anode together with a cathode in an electrolyte, and applying a voltage between the anode and cathode. As for the cathode, carbon, aluminum, or the like is used. There is not any specific restriction on the electrolyte, and an acid electrolyte that includes one kind or two or more kinds of acids, such as sulfuric acid, phosphoric acid, chromic acid, oxalic acid, sulfamic acid, benzenesulfonic acid, amido-sulfonic acid, and the like, is preferably used.

There is not any specific restriction on the anodizing conditions, which are dependent on the electrolyte used. As for the anodizing conditions, for example, the following are appropriate: an electrolyte concentration of 1 to 80% by mass; a solution temperature of 5 to 70° C.; a current density of 0.005 to 0.60 $A/cm^2$; a voltage of 1 to 200 V; and an electrolyzing time of 3 to 500 minutes.

As for the electrolyte, a sulfuric acid, a phosphoric acid, an oxalic acid, or a mixture thereof may preferably be used. When such an electrolyte is used, the following conditions are preferable: an electrolyte concentration of 4 to 30% by mass, a solution temperature of 10 to 30° C., a current density of 0.05 to 0.30 $A/cm^2$, and a voltage of 30 to 150 V.

As shown in FIG. 3, when Al-based Al base 11 is anodized, an oxidization reaction proceeds from surface 11s in a direction substantially perpendicular to surface 11s, and $Al_2O_3$-based anodized film 12 is formed. Anodized film 12 generated by the anodization has a structure in which multiple fine columnar bodies, each having a substantially regular hexagonal shape in plan view, are tightly arranged. Each fine columnar body 12a has a fine pore 12b, substantially in the center, extending substantially linearly in a depth direction from surface 11s, and the bottom surface of each fine columnar body 12a has a rounded shape. Normally, a barrier layer without any fine pore 12b is formed at a bottom area of fine columnar bodies 12a. Anodized film 12 without fine pores 12b may be formed using appropriate anodization conditions.

There is not any specific restriction on the thicknesses of Al base 11 and anodized film 12. In view of the mechanical strength of substrate 10 and the trend toward thinness and lightness of the device, the thickness of Al base 11 prior to anodization is, for example, 0.05 to 0.6 mm, and more preferably 0.1 to 0.3 mm. When insulation properties, mechanical strength, and the trend toward thinness and lightness are taken into account, a preferable thickness range of anodized film 12 is 0.1 to 100 μm.

(Lower Electrode)

There is not any specific restriction on the major component of lower electrode (back contact electrode) 20 and Mo, Cr, W, or a combination thereof is preferably used, in which Mo is particularly preferable. There is not any specific restriction on the thickness of lower electrode (back contact electrode) 20 and 200 to 1000 nm is preferable.

(Photoelectric Conversion Layer)

There is not any specific restriction on the major component of photoelectric conversion layer 30. Since high photoelectric conversion efficiency can be obtained, it is preferable that the major component of photoelectric conversion layer 30 is at least one kind of compound semiconductor having a chalcopyrite structure and more preferably, the compound semiconductor is a semiconductor formed of a group Ib element, a group IIIb element, and a group VIb element.

Preferably, the group Ib element is at least one kind of element selected from the group consisting of Cu and Ag, the group IIIb element is at least one kind of element selected from the group consisting of Al, Ga, and In, and the group VIb element is at least one kind of element selected from the group consisting of S, Se, and Te.

Such compound semiconductors described above include $CuAlS_2$, $CuGaS_2$, $CuInS_2$, $CuAlSe_2$, $CuGaSe_2$, $AgAlS_2$, $AgGaS_2$, $AgInS_2$, $AgAlSe_2$, $AgGaSe_2$, $AgInSe_2$, $AgAlTe_2$, $AgGaTe_2$, $AgInTe_2$, $Cu(In, Al) Se_2$, $Cu (In, Ga) (S, Se)_2$, $Cu_{1-z}In_{1-x}Ga_xSe_{2-y}S_y$ (where, $0 \leq x \leq 1$, $0 \leq y \leq 2$, $0 \leq z \leq 1$) (CI(G)S), $Ag(In, Ga)Se_2$, $Ag (In, Ga) (S, Se)_2$, and the like.

There is not any specific restriction on the film thickness of photoelectric conversion layer 30, and 1.0 to 3.0 μm is preferable and 1.5 to 2.0 μm is more preferable.

(Buffer Layer)

Buffer layer 40 is provided for (1) prevention of recombination of photogenerated carriers (2) band discontinuity alignment (3) lattice matching (4) coverage of surface unevenness of the photoelectric conversion layer, and the like. In the present embodiment, buffer layer 40 is formed of a Zn compound layer consisting primarily of Zn (S, O) and/or Zn(S, O, OH) and manufactured by the buffer layer manufacturing method of the present invention described above. There is not any specific restriction on the conductivity type of buffer layer 40 and n-type or the like is preferable. There is not any specific restriction on the film thickness of buffer layer 40, in which 2 nm to 2 μm is preferable and 3 to 200 nm is more preferable.

(Window Layer)

Window layer 50 is an intermediate layer for introducing light. There is not any specific restriction on the composition of window layer 50, and i-ZnO or the like is preferable. There is not any specific restriction on the film thickness of window layer 50, in which 10 nm to 2 μm is preferable and 15 to 200 nm is more preferable. Window layer 50 is not essential and some of the photoelectric conversion devices do not have window layer 50.

(Translucent Conductive Layer)

Translucent conductive layer (transparent electrode) 60 functions as a layer for introducing light and allowing a current generated in photoelectric conversion layer 30 to flow therethrough with lower electrode 20 as a pair. There is not any specific restriction on the composition of translucent conductive layer 60, and n-ZnO, such as ZnO:Al, or the like is preferable. There is not any specific restriction on the film thickness of translucent conductive layer 60, and 50 nm to 2 μm is preferable.

(Upper Electrode)

There is not any specific restriction on the major component of upper electrode (grid electrode) 70, and Al or the like is preferably used. There is not any specific restriction on the film thickness of upper electrode 70, and 0.1 to 3 μm is preferable.

Photoelectric conversion device 1 of the present embodiment is structured in the manner as described above. Photoelectric conversion device 1 can be favorably used for solar cell applications and the like. It can be turned into a solar cell by attaching, as required, a cover glass, a protection film, and the like. The present invention is not limited to the embodiment described above, and design changes may be made as appropriate without departing from the sprit of the invention.

EXAMPLES

Examples and comparative examples will now be described.

<Preparation of Reaction Solutions 1 to 21>

Component (Z), component (S), component (C), component (N), NaOH, and water were mixed in ratios shown in Tables 1 and 2 to prepare reaction solutions 1 to 21. An aqueous solution (I) of the component (Z), an aqueous solution (II) of the component (S), an aqueous solution (III) of the component (C), and an aqueous solution (IV) of the component (N) were prepared separately and then mixed together. When mixing the aqueous solutions (I) to (IV), the aqueous solution (IV) was added last. It is very important to add the aqueous solution (IV) last in order to prepare a transparent reaction solution. NaOH was added only to Reaction Solution 10. When preparing Reaction Solution 10, NaOH was added after aqueous solutions (I) to (IV) were mixed.

Reaction Solution 19 was prepared by adding the aqueous solution (IV) without adding the aqueous solution (III) (zero M for component (C)) but, when the aqueous solution (IV) was added, the reaction solution started to become opaque white and did not become transparent. Consequently, pH measurement before the start of reaction was not conducted and denoted as "Not Measured" in Table 2. The tables include the pH of each reaction solution before the start of reaction. Further, a condition outside of the present invention is denoted by a "x" mark in the tables.

Examples 1 to 12, Comparative Examples 1 to 9

A Mo lower electrode was formed on a soda-lime glass (SLG) substrate of 30 mm×30 mm with a thickness of 0.8 μm by sputtering. Then, a $Cu(In_{0.7}Ga_{0.3})Se_2$ layer was formed on the substrate with a thickness of 1.8 μm by three-stage process which is known as one of the film forming methods for CIGS layers.

Then, a buffer layer consisting primarily of Zn(S, O) and/or Zn(S, O, OH) was formed by CBD method using each of the reaction solutions 1 to 21. More specifically, the buffer layer was formed by dipping each substrate with the CIGS layer formed thereon in each 500 ml reaction solution which is temperature controlled at a predetermined value for a predetermined time, then picking up the substrate from the reaction solution, and drying the substrate at room temperature. When dipping each substrate in each reaction solution, the substrate was placed such that the surface thereof is perpendicular to the bottom of the reaction solution vessel. The type of reaction solution, reaction temperature, reaction time, and pH values before and after reaction in each example are shown in Tables 3 and 4. A condition outside of the present invention is denoted by a "x" mark in the tables.

<Evaluation 1 (Film Coverage Over Glass Substrate)>

In each example, a buffer layer consisting primarily of Zn (S, O) and/or Zn (S, O, OH) was formed by CBD method using a glass substrate under the same condition. A transmission factor of each substrate, having a thin film formed thereon, at a wavelength of 550 nm was measured with a glass substrate not having a thin film as the reference (100%) and an evaluation was conducted based on the criteria shown below. A low transmission factor of a substrate having a thin film formed thereon signifies that the glass substrate was well covered by the thin film.

[Evaluation Criteria]

○:50% to 87%, Δ: over 87% to 92%, x: over 92% or less than 50%<

Evaluation 2 (Film Coverage Over CIGS Layer)>

A SEM observation was performed on each CIGS substrate having a buffer layer formed thereon and an evaluation was conducted based on the criteria shown below.

[Evaluation Criteria]

○: A buffer layer completely covering the CIGS underlayer was formed.

x: A portion of the CIGS underlayer was exposed.

<Evaluation Results>

Figure 4:
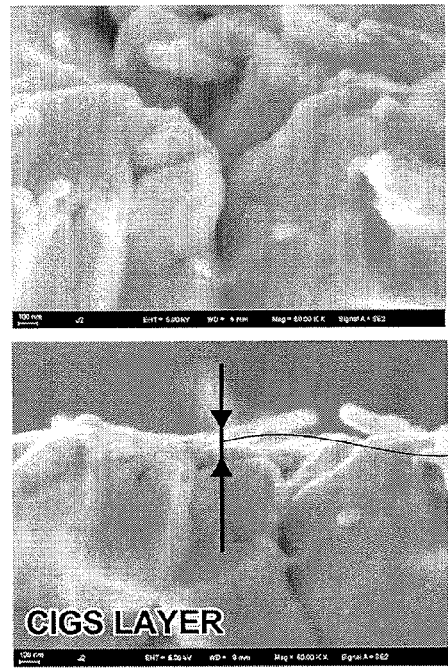
FIG. 4 shows SEM images of an example.

The evaluation results are shown in Tables 3 and 4. In Examples 1 to 12 that satisfies the conditions of the present invention, a buffer layer well covering the underlayer was formed without requiring a fine particle layer. Typical SEM photographs (perspective view and cross-sectional view) are shown in FIG. 4. The use of Reaction Solution 11 that satisfies the conditions of the present invention allowed a buffer layer well covering the underlayer to be formed as in Examples 1 to 12.

In Comparative Examples 1 to 8 that do not satisfy the conditions of the present invention, a buffer layer well covering the underlayer could not be formed. The use of Reaction Solution 8 or 9 that does not satisfy the conditions of the present invention did not allow a buffer layer well covering the underlayer to be formed as in Comparative Examples 1 to 8.

TABLE 1

|  | REACTION SOLUTION 1 | REACTION SOLUTION 2 | REACTION SOLUTION 3 | REACTION SOLUTION 4 | REACTION SOLUTION 5 |
|---|---|---|---|---|---|
| (Z) | ZINC SULFATE | ZINC SULFATE | ZINC SULFATE | ZINC SULFATE | ZINC SULFATE |
| (Z) CONCENTRATION [M] | 0.03 | 0.03 | 0.03 | 0.03 | 0.03 |
| (S) | THIOUREA | THIOUREA | THIOUREA | THIOUREA | THIOUREA |
| (S) CONCENTRATION [M] | 0.05 | 0.05 | 0.05 | 0.05 | 0.05 |
| (C) | SODIUM CITRATE | SODIUM CITRATE | SODIUM CITRATE | SODIUM CITRATE | SODIUM CITRATE |
| (C) CONCENTRATION [M] |  |  |  |  |  |

TABLE 1-continued

|  | | | | | |
|---|---|---|---|---|---|
|  | 0.03 | 0.03 | 0.03 | 0.03 | 0.03 |
| (N) | NH$_4$OH | NH$_4$OH | NH$_4$OH | NH$_4$OH | NH$_4$OH |
| (N) CONCENTRATION [M] | 0.00 x | 0.15 | 0.30 | 0.40 | 0.45 x |
| NaOH CONCENTRATION [M] | — | — | — | — | — |
| pH (BEFORE START OF REACTION) | 6.2 | 10.3 | 10.5 | 10.6 | 10.8 |

|  | REACTION SOLUTION 6 | REACTION SOLUTION 7 | REACTION SOLUTION 8 | REACTION SOLUTION 9 | REACTION SOLUTION 10 |
|---|---|---|---|---|---|
| (Z) | ZINC SULFATE | ZINC SULFATE | ZINC SULFATE | ZINC SULFATE | ZINC SULFATE |
| (Z) CONCENTRATION [M] | 0.03 | 0.03 | 0.03 | 0.03 | 0.03 |
| (S) | THIOUREA | THIOUREA | THIOUREA | THIOUREA | THIOUREA |
| (S) CONCENTRATION [M] | 0.05 | 0.05 | 0.05 | 0.05 | 0.05 |
| (C) | SODIUM CITRATE | SODIUM CITRATE | SODIUM CITRATE | SODIUM CITRATE | SODIUM CITRATE |
| (C) CONCENTRATION [M] | 0.03 | 0.03 | 0.03 | 0.03 | 0.03 |
| (N) | NH$_4$OH | NH$_4$OH | NH$_4$OH | NH$_4$OH | NH$_4$OH |
| (N) CONCENTRATION [M] | 0.60 x | 0.75 x | 0.90 x | 1.20 x | 0.00 x |
| NaOH CONCENTRATION [M] | — | — | — | — | 0.15 |
| pH (BEFORE START OF REACTION) | 10.9 | 11.0 | 11.1 | 11.3 | 13.3 x |

TABLE 2

|  | REACTION SOLUTION 11 | REACTION SOLUTION 12 | REACTION SOLUTION 13 | REACTION SOLUTION 14 | REACTION SOLUTION 15 | REACTION SOLUTION 16 |
|---|---|---|---|---|---|---|
| (Z) | ZINC SULFATE | ZINC SULFATE | ZINC SULFATE | ZINC SULFATE | ZINC SULFATE | ZINC ACETATE |
| (Z) CONCENTRATION [M] | 0.03 | 0.03 | 0.03 | 0.03 | 0.03 | 0.03 |
| (S) | THIOUREA | THIOUREA | THIOUREA | THIOUREA | THIOUREA | THIOUREA |
| (S) CONCENTRATION [M] | 0.05 | 0.05 | 0.05 | 0.05 | 0.05 | 0.05 |
| (C) | SODIUM CITRATE | SODIUM CITRATE | SODIUM CITRATE | SODIUM CITRATE | SODIUM CITRATE | SODIUM CITRATE |
| (C) CONCENTRATION [M] | 0.045 | 0.06 | 0.15 | 0.225 | 0.30 x | 0.03 |
| (N) | NH$_4$OH | NH$_4$OH | NH$_4$OH | NH$_4$OH | NH$_4$OH | NH$_4$OH |
| (N) CONCENTRATION [M] | 0.15 | 0.15 | 0.15 | 0.15 | 0.15 | 0.15 |
| NaOH CONCENTRATION [M] | — | — | — | — | — | — |
| pH (BEFORE START OF REACTION) | 10.4 | 10.4 | 10.5 | 10.5 | 10.6 | 10.5 |

|  | REACTION SOLUTION 17 | REACTION SOLUTION 19 | REACTION SOLUTION 20 | REACTION SOLUTION 21 |
|---|---|---|---|---|
| (Z) | ZINC NITRATE | ZINC SULFATE | ZINC SULFATE | ZINC SULFATE |
| (Z) CONCENTRATION [M] | 0.03 | 0.03 | 0.03 | 0.03 |
| (S) | THIOUREA | THIOUREA | THIOUREA | THIOUREA |
| (S) CONCENTRATION [M] | 0.05 | 0.05 | 0.05 | 0.05 |
| (C) | SODIUM CITRATE | SODIUM CITRATE | SODIUM CITRATE | SODIUM CITRATE |
| (C) CONCENTRATION [M] | 0.03 | 0 x | 0.03 | 0.015 |
| (N) | NH$_4$OH | NH$_4$OH | NH$_4$OH | NH$_4$OH |
| (N) CONCENTRATION [M] | 0.15 | 0.15 | 0.10 | 0.30 |
| NaOH CONCENTRATION [M] | — | — | — | — |
| pH (BEFORE START OF REACTION) | 10.6 | NOT MEASURED (WHITE OPAQUE) | 10.1 | 10.4 |

TABLE 3

|  | EXAMPLE 1 | EXAMPLE 2 | EXAMPLE 3 | EXAMPLE 4 | EXAMPLE 5 | EXAMPLE 6 |
|---|---|---|---|---|---|---|
| SUBSTRATE | CIGS/Mo/SLG | CIGS/Mo/SLG | CIGS/Mo/SLG | CIGS/Mo/SLG | CIGS/Mo/SLG | CIGS/Mo/SLG |

TABLE 3-continued

| REACTION SOLUTION | REACTION SOLUTION 2 | REACTION SOLUTION 3 | REACTION SOLUTION 4 | REACTION SOLUTION 12 | REACTION SOLUTION 13 | REACTION SOLUTION 14 |
|---|---|---|---|---|---|---|
| pH (BEFORE START OF REACTION) | 10.3 | 10.5 | 10.6 | 10.4 | 10.5 | 10.5 |
| REACTION TEMPERATURE | 90° C. | 90° C. | 90° C. | 90° C. | 90° C. | 90° C. |
| REACTION TIME | 60 min | 60 min | 60 min | 60 min | 60 min | 60 min |
| pH (AFTER REACTION) | 10.1 | 10.3 | 10.4 | 10.0 | 10.0 | 10.0 |
| EVALUATION 1: FILM COVERAGE OVER GLASS SUBSTRATE | ○ | ○ | ○ | Δ | Δ | Δ |
| EVALUATION 2: FILM COVERAGE OVER CIGS LAYER | ○ | ○ | ○ | Δ | Δ | Δ |

| | EXAMPLE 7 | EXAMPLE 8 | EXAMPLE 10 | EXAMPLE 11 | EXAMPLE 12 |
|---|---|---|---|---|---|
| SUBSTRATE | CIGS/Mo/SLG | CIGS/Mo/SLG | CIGS/Mo/SLG | CIGS/Mo/SLG | CIGS/Mo/SLG |
| REACTION SOLUTION | REACTION SOLUTION 16 | REACTION SOLUTION 17 | REACTION SOLUTION 20 | REACTION SOLUTION 21 | REACTION SOLUTION 2 |
| pH (BEFORE START OF REACTION) | 10.6 | 10.6 | 10.1 | 10.4 | 10.3 |
| REACTION TEMPERATURE | 90° C. | 90° C. | 90° C. | 90° C. | 75° C. |
| REACTION TIME | 60 min | 60 min | 60 min | 60 min | 300 min |
| pH (AFTER REACTION) | 10.1 | 10.0 | 9.8 | 10.1 | 10.1 |
| EVALUATION 1: FILM COVERAGE OVER GLASS SUBSTRATE | ○ | ○ | ○ | ○ | ○ |
| EVALUATION 2: FILM COVERAGE OVER CIGS LAYER | ○ | ○ | ○ | ○ | ○ |

TABLE 4

| | COMPARATIVE EXAMPLE 1 | COMPARATIVE EXAMPLE 2 | COMPARATIVE EXAMPLE 3 | COMPARATIVE EXAMPLE 4 |
|---|---|---|---|---|
| SUBSTRATE | CIGS/Mo/SLG | CIGS/Mo/SLG | CIGS/Mo/SLG | CIGS/Mo/SLG |
| REACTION SOLUTION | REACTION SOLUTION 1 x | REACTION SOLUTION 5 x | REACTION SOLUTION 6 x | REACTION SOLUTION 7 x |
| pH (BEFORE START OF REACTION) | 6.2 x | 10.8 | 10.9 | 11.0 |
| REACTION TEMPERATURE | 90° C. | 90° C. | 90° C. | 90° C. |
| REACTION TIME | 60 min | 60 min | 60 min | 60 min |
| pH (AFTER REACTION) | 5.8 | 10.8 | 10.9 | 11.0 |
| EVALUATION 1: FILM COVERAGE OVER GLASS SUBSTRATE | x | x | x | x |
| EVALUATION 2: FILM COVERAGE OVER CIGS LAYER | x | x | x | x |

| | COMPARATIVE EXAMPLE 5 | COMPARATIVE EXAMPLE 6 | COMPARATIVE EXAMPLE 7 | COMPARATIVE EXAMPLE 8 |
|---|---|---|---|---|
| SUBSTRATE | CIGS/Mo/SLG | CIGS/Mo/SLG | CIGS/Mo/SLG | CIGS/Mo/SLG |
| REACTION SOLUTION | REACTION SOLUTION 10 x | REACTION SOLUTION 15 x | REACTION SOLUTION 2 | REACTION SOLUTION 19 x |
| pH (BEFORE START OF REACTION) | 13.3 x | 10.6 | 10.3 | 9.6 |
| REACTION TEMPERATURE | 90° C. | 90° C. | 65° C. x | 90° C. |
| REACTION TIME | 60 min | 60 min | 60 min | 60 min |
| pH (AFTER REACTION) | 13.2 x | 10.1 | 10.3 | 9.4 |
| EVALUATION 1: FILM COVERAGE OVER GLASS SUBSTRATE | x | x | x | x |

TABLE 4-continued

| | | | | |
|---|---|---|---|---|
| EVALUATION 2: FILM COVERAGE OVER CIGS LAYER | x | x | x | x |

TABLE 5

| | EXAMPLE 1 (WITHOUT ANNEALING) | EXAMPLE 1 (ANNEALING AT 200° C. FOR ONE HOUR) |
|---|---|---|
| CONVERSION EFFICIENCY η[%] | 8.9 | 14.1 |
| LIGHT RECEIVING AREA [cm$^2$] | 0.516 | 0.516 |
| OPEN-CIRCUIT VOLTAGE Voc [V] | 0.49 | 0.6 |
| SHORT-CIRCUIT CURRENT DENSITY Jsc[mA/cm$^2$] | 32.9 | 35.1 |
| FILL FACTOR FF[%] | 0.55 | 0.68 |

<Evaluation of Photoelectric Conversion Efficiency>

An i-ZnO layer (window layer) with a thickness of 50 nm, an aluminum-doped ZnO (ZnO:Al) layer (transparent electrode layer) with a thickness of 300 nm are formed by sputtering on the buffer layer formed in Example 1. Then, an Al electrode was formed as the upper electrode by a deposition method to obtain a photoelectric conversion device.

Further, another photoelectric conversion device was produced in the same manner as described above except for annealing at 200° C. in the ambient atmosphere performed prior to forming the window layer.

With respect to the two photoelectric conversion devices so obtained, current-voltage characteristic evaluations were performed using a solar simulator, in which the energy conversion efficiency was evaluated using pseudo sunlight of Air Mass (AM)=1.5, 100 mW/cm$^2$ and stable photoelectric conversion characteristics were obtained for each device. Table 5 shows the I-V characteristic measurement results. As shown in Table 5, it has been confirmed that the conversion efficiency is increased by performing the annealing after forming the buffer layer.

The buffer layer and the buffer layer manufacturing method of the present invention may be applied to a photoelectric conversion device for use in solar cells, infrared sensors, and the like.

What is claimed is:

1. A method of manufacturing a buffer layer of a photoelectric conversion device having a stacked structure in which a lower electrode, a photoelectric conversion semiconductor layer that generates a current by absorbing light, the buffer layer, a translucent conductive layer, and an upper electrode are stacked on a substrate, the method comprising:
    a preparation step for preparing a reaction solution which includes a component (Z) of at least one kind of zinc source, a component (S) of at least one kind of sulfur source, a component (C) of at least one kind of citrate compound, a component (N) of at least one kind selected from the group consisting of ammonia and ammonium salt, and water, wherein:
    the concentration of the component (C) is 0.001 to 0.25M;
    the concentration of the component (N) is 0.001 to 0.40M; and
    the pH before the start of reaction is 9.0 to 12.0; and
    a film forming step for forming a Zn compound layer consisting primarily of Zn(S, O) and/or Zn(S, O, OH) by a liquid phase method with a reaction temperature of 70 to 95° C.

2. The method of claim 1, wherein, in the preparation step, the component (N) is mixed in a mixed solution of the component (Z), component (S), component (C), and water.

3. The method of claim 1, wherein in the preparation step, the reaction solution is prepared so as to have a pH of 7.5 to 11.0 after the film forming step.

4. The method of claim 1, wherein, in the preparation step, at least one kind of zinc source selected from the group consisting of zinc sulfate, zinc acetate, zinc nitrate, and hydrates thereof is used as the component (Z).

5. The method of claim 1, wherein, in the preparation step, a sulfur source which includes thiourea is used as the component (S).

6. The method of claim 1, wherein, in the preparation step, a citrate compound which includes sodium citrate and/or a hydrate thereof is used as the component (C).

7. The method of claim 1, wherein, after the film forming step, at least the buffer layer is annealed.

8. The method of claim 1, wherein a major component of the photoelectric conversion semiconductor layer is at least one kind of compound semiconductor having a chalcopyrite structure.

9. The method of claim 8, wherein the at least one kind of compound semiconductor is a semiconductor formed of a group Ib element, a group IIIb element, and a group VIb element.

10. The method of claim 9, wherein:
    the group Ib element is at least one kind of element selected from the group consisting of Cu and Ag;
    the group IIIb element is at least one kind of element selected from the group consisting of Al, Ga, and In; and
    the group VIb element is at least one kind of element selected from the group consisting of S, Se, and Te.

11. The method of claim 1, wherein an anodized substrate selected from the group consisting of an anodized substrate formed of an Al base with an Al$_2$O$_3$-based anodized film formed on at least one surface side of Al base, an anodized substrate formed of a compound base of a Fe material and an Al material attached to at least one surface side of the Fe material with an Al$_2$O$_3$-based anodized film formed on at least one surface side of the compound base, and an anodized substrate formed of a base of a Fe material and an Al film formed on at least one surface side of the Fe material with an Al$_2$O$_3$-based anodized film formed on at least one surface side of the base of the Fe material is used as the substrate.

12. A method of preparing a reaction solution for use in manufacturing a Zn compound layer consisting primarily of Zn (S, O) and/or Zn(S, O, OH) included in a buffer layer of a photoelectric conversion device having a stacked structure in which a lower electrode, a photoelectric conversion semiconductor layer, the buffer layer, a translucent conductive layer, and an upper electrode are stacked on a substrate, the method comprising the steps of:
    preparing a mixed solution by mixing a component (Z) of at least one kind of zinc source, a component (S) of at least one kind of sulfur source, a component (C) of at least one kind of citrate compound, and water; and
    mixing a component (N) of at least one kind selected from the group consisting of ammonia and ammonium salt in the mixed solution, wherein each component is mixed through concentration control §o that the concentration of the component (C) becomes 0.001 to 0.25M, the concentration of the component (N) becomes 0.001 to 0.40M, and the pH becomes 9.0 to 12.0 in the reaction solution.

13. The method of claim 12, wherein each component is mixed through concentration control so that the pH of the reaction solution becomes 7.5 to 11.0 after a reaction for forming the Zn compound layer by chemical bath deposition.

14. The method of claim 12, wherein at least one kind of zinc source selected from the group consisting of zinc sulfate, zinc acetate, zinc nitrate, and hydrates thereof is used as the component (Z).

15. The method of claim 12, wherein thiourea is used as the component (S).

16. The method of claim 12, wherein sodium citrate and/or a hydrate thereof is used as the component (C).

* * * * *